United States Patent
So et al.

(10) Patent No.: US 9,694,433 B2
(45) Date of Patent: Jul. 4, 2017

(54) METHOD OF JOINING COOLING COMPONENT

(71) Applicant: FUJITSU LIMITED, Kawasaki-shi, Kanagawa (JP)

(72) Inventors: Tsuyoshi So, Kawasaki (JP); Hideo Kubo, Kawasaki (JP); Yoshinori Uzuka, Kawasaki (JP); Nobumitsu Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/196,632

(22) Filed: Jun. 29, 2016

(65) Prior Publication Data

US 2017/0014929 A1    Jan. 19, 2017

(30) Foreign Application Priority Data

Jul. 16, 2015   (JP) ................. 2015-141793

(51) Int. Cl.
| B23K 31/00 | (2006.01) |
| B23K 31/02 | (2006.01) |
| B23K 1/00 | (2006.01) |
| B23K 35/02 | (2006.01) |
| B23K 35/30 | (2006.01) |
| H05K 1/02 | (2006.01) |
| H01L 23/473 | (2006.01) |
| B23K 101/40 | (2006.01) |

(52) U.S. Cl.
CPC .......... *B23K 1/0016* (2013.01); *B23K 35/025* (2013.01); *B23K 35/3006* (2013.01); *H01L 23/473* (2013.01); *H05K 1/0204* (2013.01); *H05K 1/0209* (2013.01); *B23K 2201/40* (2013.01); *H05K 2201/066* (2013.01); *H05K 2201/10409* (2013.01)

(58) Field of Classification Search
CPC ..... H01L 21/4882; H01L 21/52; H01L 23/13; H01L 23/3675
USPC ....................................... 228/122.1
See application file for complete search history.

(56) References Cited

U.S. PATENT DOCUMENTS

| 5,383,518 A * | 1/1995 | Banks ................. F28D 9/005 165/166 |
| 6,549,411 B1 * | 4/2003 | Herbert ............... H01L 23/367 257/E23.102 |
| 2012/0279761 A1 | 11/2012 | Hori et al. |

FOREIGN PATENT DOCUMENTS

| JP | 2011-166122 | 8/2011 |
| JP | 2011-171569 | 9/2011 |

* cited by examiner

*Primary Examiner* — Erin Saad
(74) *Attorney, Agent, or Firm* — Fujitsu Patent Center

(57) ABSTRACT

A disclosed method of joining a cooling component includes joining an electronic component and a spherical shaped bottom plate of a cooling component to each other by pressing the bottom plate against the electronic component, while providing a thermal bonding material between the bottom plate and the electronic component.

4 Claims, 19 Drawing Sheets

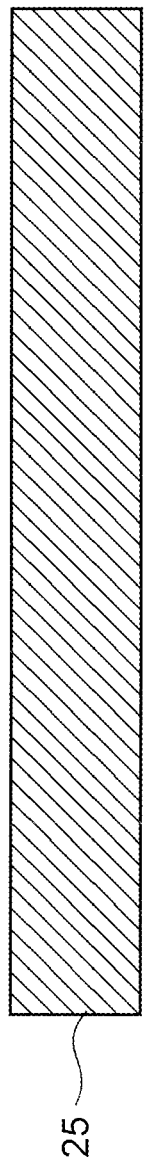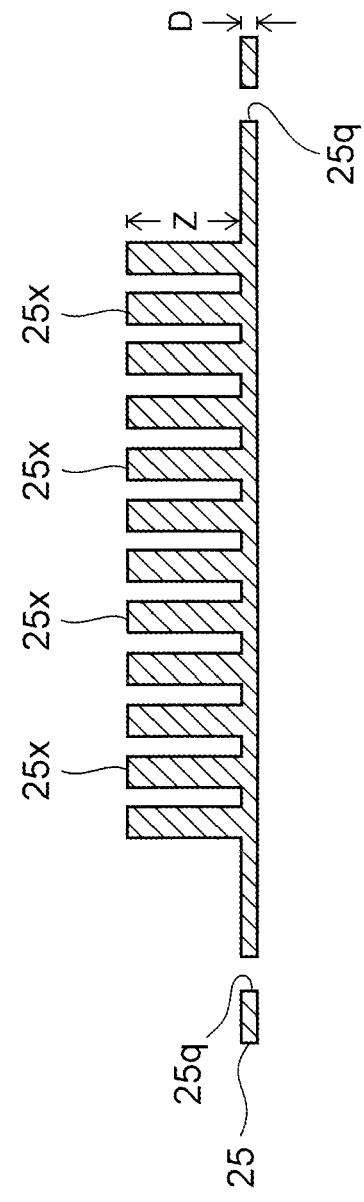
FIG.14A
FIG.14B

METHOD OF JOINING COOLING COMPONENT

CROSS-REFERENCE TO RELATED APPLICATION(s)

This application is based upon and claims the benefit of priority of the prior Japanese Patent Application No. 2015-141793, filed on Jul. 16, 2015, the entire contents of which are incorporated herein by reference.

FIELD

The embodiments discussed herein are related to a method of joining a cooling component.

BACKGROUND

Electronic components such as a CPU (Central Processing Unit) are mounted in electronic devices such as servers and personal computers. When the electronic components generate heat exceeding an allowable temperature, the operation of the electronic components cannot be guaranteed, and the electronic components fail to operate properly. In order to prevent this, the server and the like are provided with cooling components for cooling the electronic components.

The cooling components are roughly classified into those using an air cooling method and those using a liquid cooling method. Among these methods, the liquid cooling method includes a method in which an electronic component is cooled with liquid coolant and a gas-liquid two phase method. The former method is a method of cooling the electronic component with the coolant maintained in the liquid phase without being vaporized. Since the heat capacity of the liquid coolant is far greater than that of air, this method has such an advantage that the transfer speed of heat is higher than that in the air cooling method.

Meanwhile, the latter method, the gas-liquid two phase method is a method of cooling the electronic component by using the heat of vaporization of coolant such as water. This method has an advantage over the other cooling methods in that it is possible to quickly take away the heat of the electronic component by using the heat of vaporization and to achieve excellent cooling efficiency.

In both of the two liquid cooling methods described above, a space to which the coolant is supplied is defined in the cooling component, and a bottom plate partitioning this space from the outside is provided in the cooling component. Then, by joining the bottom plate and the electronic component, the coolant takes away the heat of the electronic component, and the electronic component is thereby cooled.

Here, in order to efficiently transfer the heat of the electronic component to the coolant in the cooling component via the bottom plate, the heat resistance of the bottom plate is preferably reduced by making the bottom plate as thin as possible.

However, when the bottom plate is made thin in this manner, the bottom plate may be deformed due to decrease of its strength. When the deformation occurs, the bottom plate is separated from the electronic component, and hence the cooling component cannot efficiently cool the electronic component.

Techniques related to the present application are described in Japanese Laid-open Patent Publication No. 2011-171569 and Japanese Laid-open Patent Publication No. 2011-166122.

SUMMARY

According to one aspect discussed herein, there is provided a method of joining a cooling component including: joining an electronic component and a spherical shaped bottom plate of a cooling component to each other by pressing the bottom plate against the electronic component, while providing a thermal bonding material between the bottom plate and the electronic component.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 14A to 14D are cross-sectional views in the course of manufacturing of the cooling component according to the present embodiment.

DESCRIPTION OF EMBODIMENTS

Prior to explaining the present embodiment, the matters studied by the inventors of the present application are described.

Figure 1:
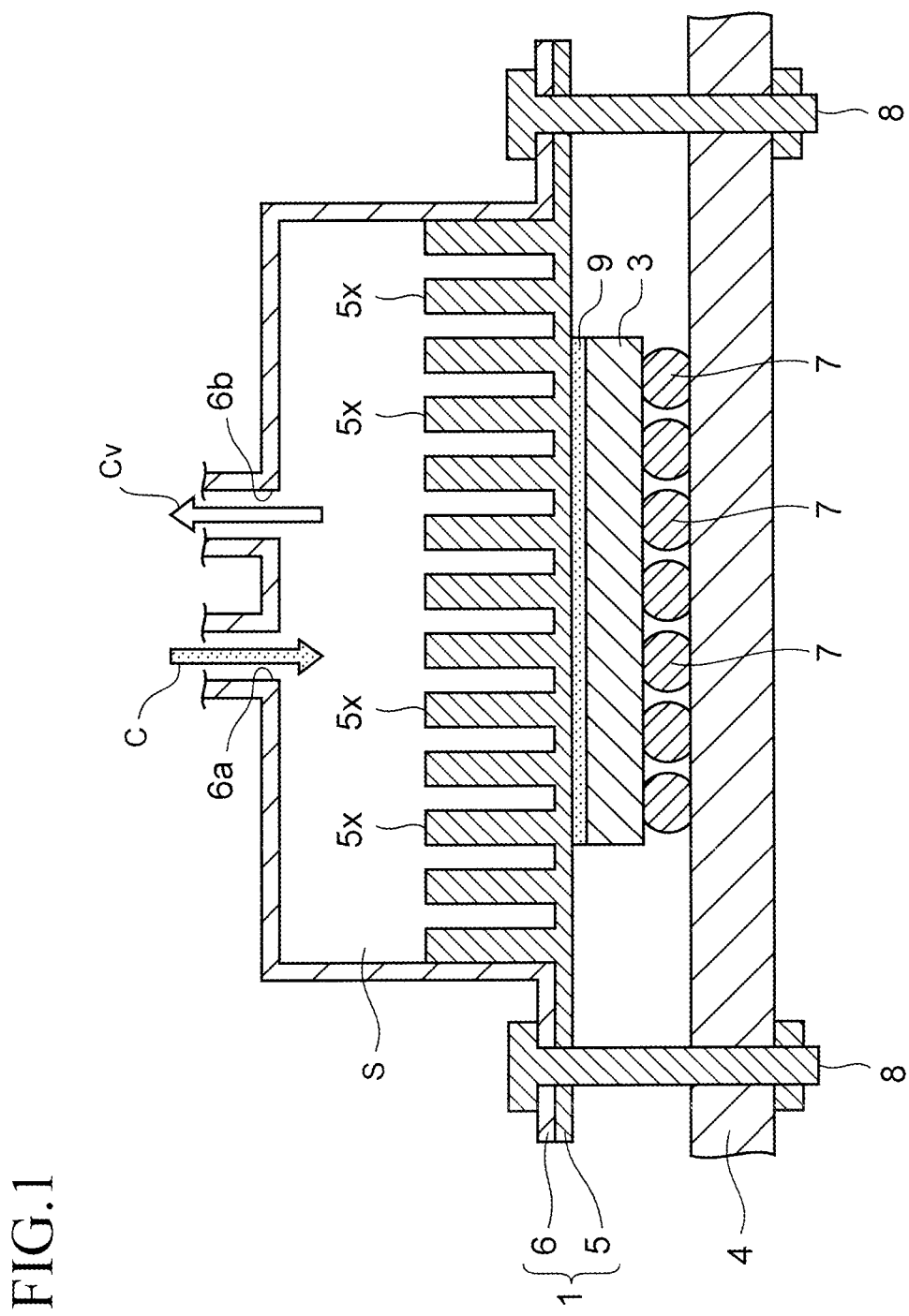
FIG. 1 is a cross-sectional view of the studied cooling component and its vicinity for use in the liquid cooling method.

FIG. 1 is a cross-sectional view of the studied cooling component and its vicinity for use in the liquid cooling method.

The liquid cooling method includes a method of cooling an electronic component with liquid coolant and a gas-liquid two phase method as described above. In this example, description is given of the case where the method of cooling an electronic component with liquid coolant is employed as in the former method.

The cooling component 1 includes a bottom plate 5 such as a copper plate and a cover 6, and an electronic component 3 being an object to be cooled is thermally connected to the bottom plate 5. The bottom plate 5 and the cover 6 define a space S, and the electronic component 3 is cooled with coolant C such as water by supplying the coolant C into the space S.

In this example, a supply port 6a is provided in the cover 6, and the coolant C is supplied into the cooling component 1 via the supply port 6a. The coolant C cools the electronic component 3 and turns into high-temperature coolant Cv, and the coolant Cv is discharged to the outside via a discharge port 6b of the cover 6.

Moreover, the bottom plate 5 is provided with a plurality of pins 5x. Spaces among pins 5x are served as microchannel through which the coolant C flows. This configuration increases the area in which the coolant C is in contact with the bottom plate 5 as compared to the case were the bottom plate 5 is a flat plate, and hence the electronic component 3 can be effectively cooled.

Meanwhile, the electronic component 3 is a component such as CPU which generates heat at the time of operating, and is connected to a circuit board 4 via solder bumps 7. Moreover, thermal bonding material 9 is applied on a top surface of the electronic component 3, thereby the heat resistance between the electronic component 3 and the cooling component 1 is reduced. For example, thermally conductive grease can be used as the thermal bonding material 9.

Furthermore, the circuit board 4 and the cooling component 1 are mechanically fixed to each other by screws 8. By screwing the screws 8, the electronic component 3 and the bottom plate 5 are brought into tight contact with each other via the thermal bonding material 9.

In order to promote cooling of the electronic component 3 in this cooling component 1, it is conceivable to bring the electronic component 3 and the bottom plate 5 into firm and tight contact with each other by increasing the tightening force of the screws 8 and thereby reduce the thermal resistance between the electronic component 3 and the bottom plate 5.

However, it is found that the following problem is caused when the tightening force of the screws 8 is increased in this manner.

Figure 2:
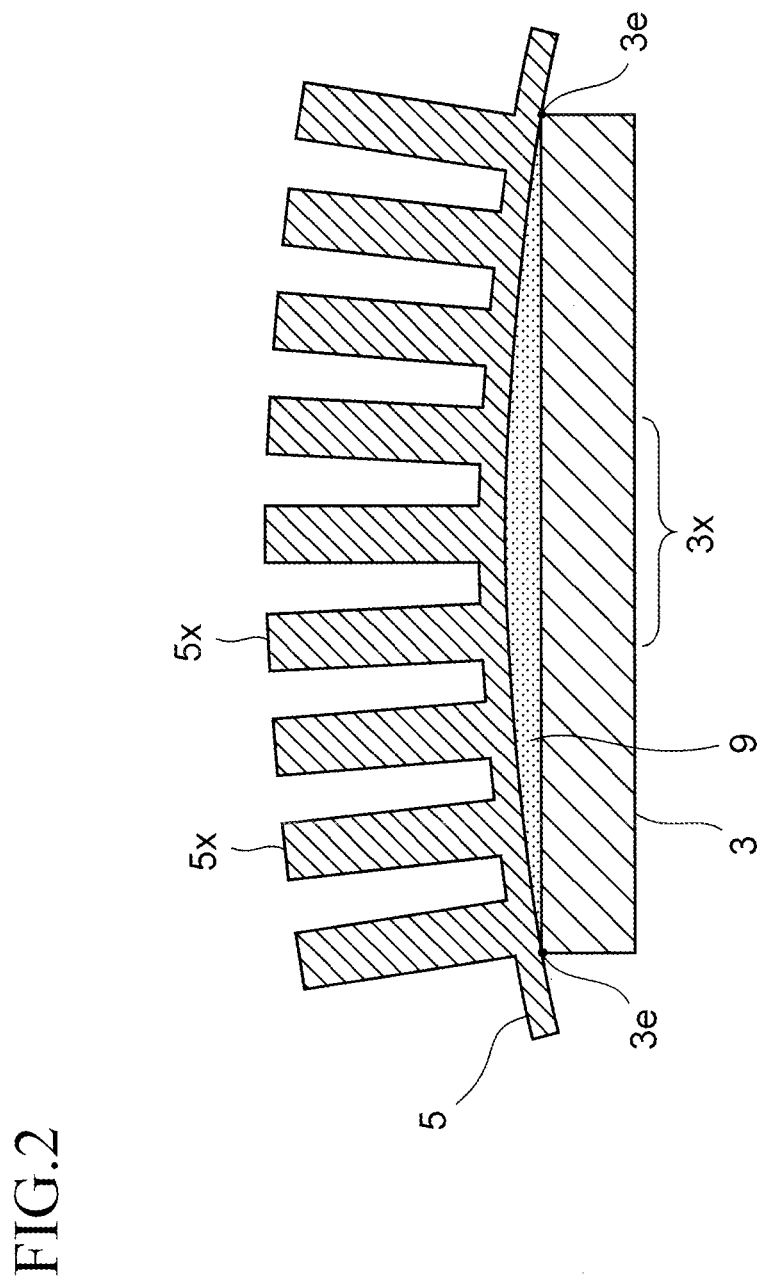
FIG. 2 is a cross-sectional view for explaining a problem of the liquid-cooled cooling component used in the study.

FIG. 2 is a cross-sectional view for explaining this problem and is an enlarged cross-sectional view of a portion around the bottom plate 5.

When the electronic component 3 and the bottom plate 5 are brought into firm and tight contact with each other, the corner portions 3e of the electronic component 3 function as pivot points and thus the bottom plate 5 curves. Thus, the center portion 3x of the electronic component 3 is widely separated from the bottom plate 5. As a result, the thermal resistance between the bottom plate 5 and the electronic component 3 increases and the cooling of the electronic component 3 with the cooling component 1 becomes difficult.

Figure 3:
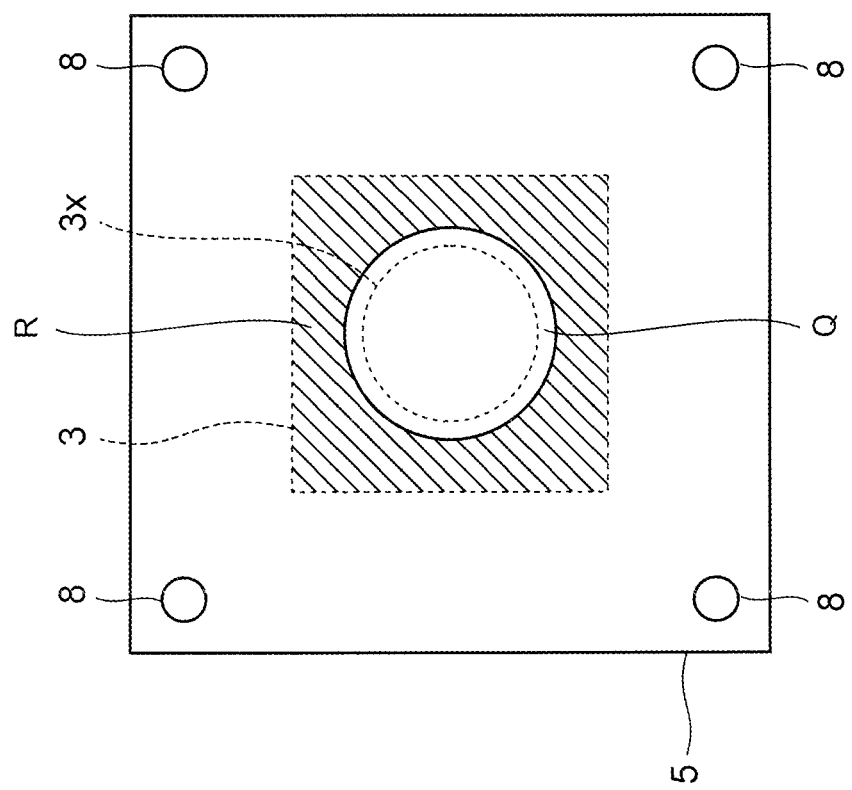
FIG. 3 is a plan view for explaining the problem of the liquid-cooled cooling component used in the study.

FIG. 3 is a plan view schematically illustrating this situation.

In FIG. 3, a region R in which the bottom plate 5 and electronic component 3 are considered to be in tight contact with each other is hatched, while a region Q in which the electronic component 3 is widely separated from the bottom plate 5 is illustrated as a white portion.

As illustrated in FIG. 3, the bottom plate 5 has a square shape in a plan view, and the aforementioned screws 8 are provided at four corners of the bottom plate 5.

The electronic component 3 receives pressing force from the screws 8 from four directions. As a result, the region Q in which the electronic component is widely separated from the bottom plate 5 has a circular shape including the center portion 3x.

Though the center portion 3x of the electronic component 3 tends to be hot and thus needs to be preferentially cooled, when the bottom plate 5 is lifted in the center portion 3x as described above, the temperature of the electronic component 3 exceeds the allowable temperature and the operation of the electronic component 3 cannot be guaranteed.

Such a problem occurs not only in the method in which an electronic component is cooled with liquid coolant as described above, but also in the gas-liquid two phase method.

Moreover, this problem occurs significantly when the bottom plate 5 is made thin in an attempt to reduce the thermal resistance of the bottom plate 5.

The present embodiment is described below.

Present Embodiment

In the present embodiment, an electronic component is efficiently cooled with a cooling component by joining the cooling component to the electronic component as described below.

Figure 4:
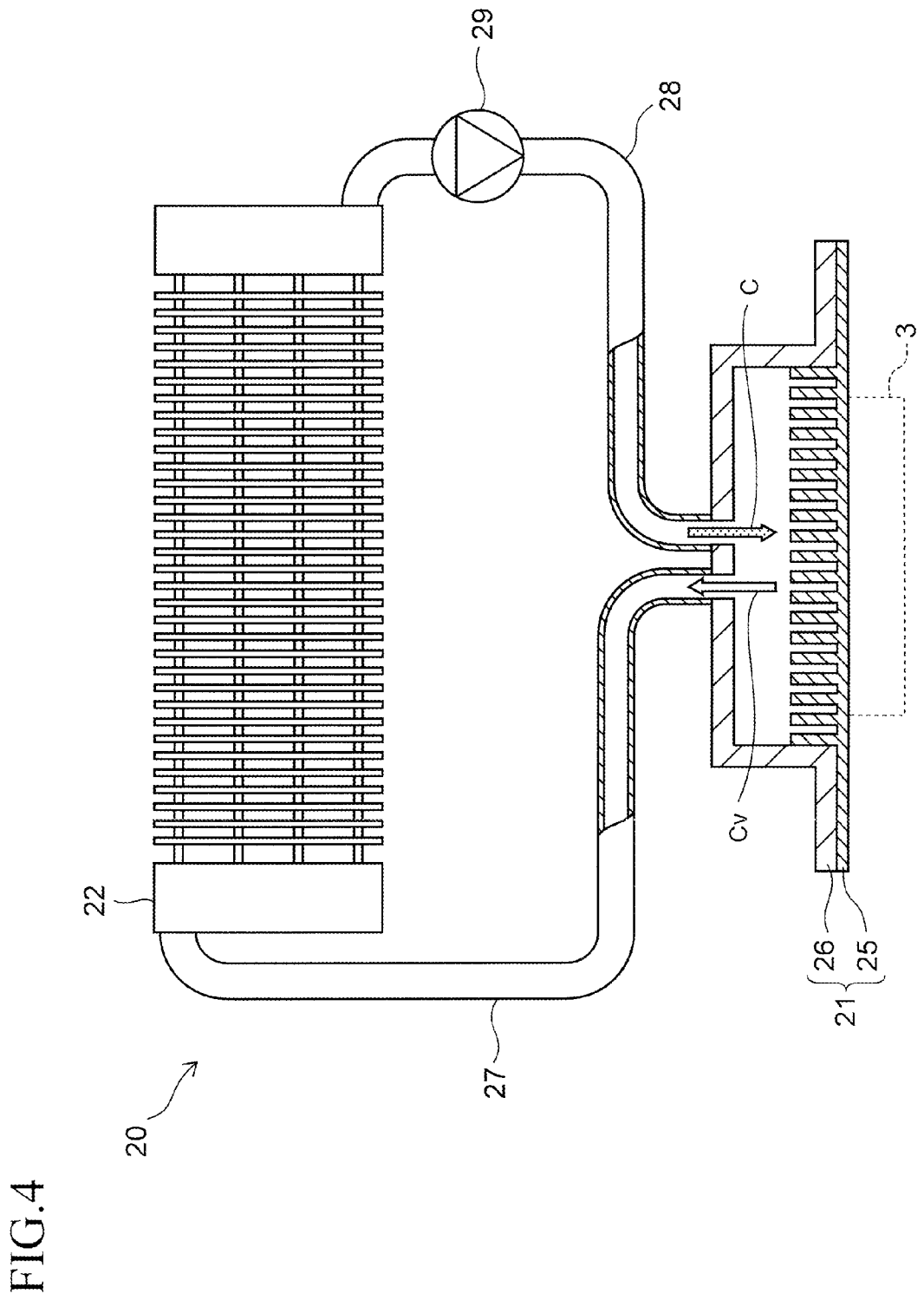
FIG. 4 is a configuration diagram of a cooling device according to the present embodiment.

FIG. 4 is a configuration diagram of a cooling device for use in the liquid cooling method according to the present embodiment.

As described above, the liquid cooling method includes the method of cooling an electronic component with liquid coolant and the gas-liquid two phase method. Either of these methods can be employed in the present embodiment. In the following example, the method of cooling an electronic component with liquid coolant as in the former method is described.

The cooling device 20 is a device which cools the electronic component 3 such as a CPU with the coolant C, and includes a cooling component 21 and a radiator 22.

The cooling component 21 includes a bottom plate 25 and a cover 26 blazed to a peripheral edge portion of the bottom plate 25, and cools the electronic component 3 with the coolant C. The coolant C is, for example, water.

The high-temperature coolant Cv generated in the cooling component 21 is cooled by the air-cooled radiator 22.

The cooling component 21 and the radiator 22 are connected to each other via a first pipe 27 and a second pipe 28, and a loop-shaped flow passage through which the coolant C is circulated is thereby formed. Moreover, a pump 29 which circulates the coolant C in the flow passage is provided in the second pipe 28.

Note that in the case of employing the gas-liquid two phase method, a condenser may be provided instead of the radiator 22 to liquefy coolant vapor generated in the cooling component 21.

Furthermore, in the case where the coolant C circulates by itself without the pump 29, the pump 29 may be omitted.

Figure 5:
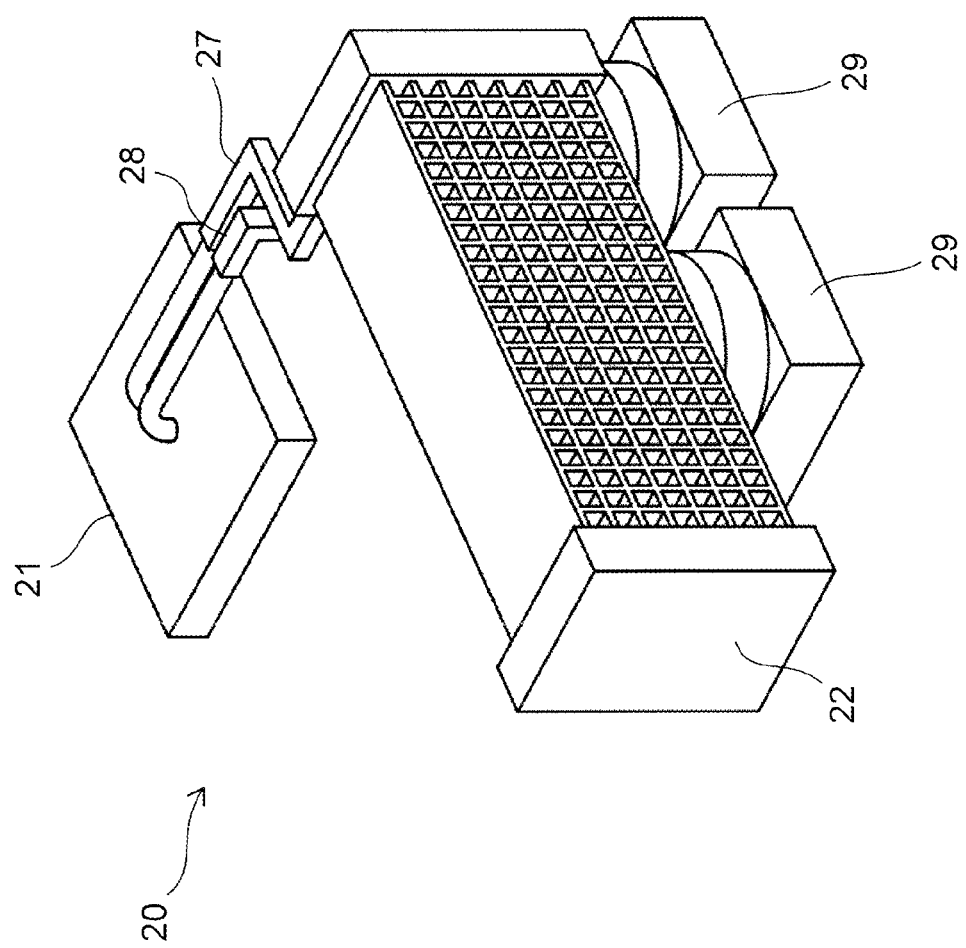
FIG. 5 is a perspective view illustrating an example of arrangement of a cooling component and a radiator according to the present embodiment.

FIG. 5 is a perspective view illustrating an example of arrangement of the cooling component 21 and the radiator 22.

In this example, the cooling component 21 is provided beside the radiator 22, and the cooling component 21 and the radiator 22 are connected to each other by the first pipe 27 and the second pipe 28 which extend in the horizontal direction. Moreover, two pumps 29 are provided in a portion of the second pipe 28 hidden below the radiator 22.

Figure 6:
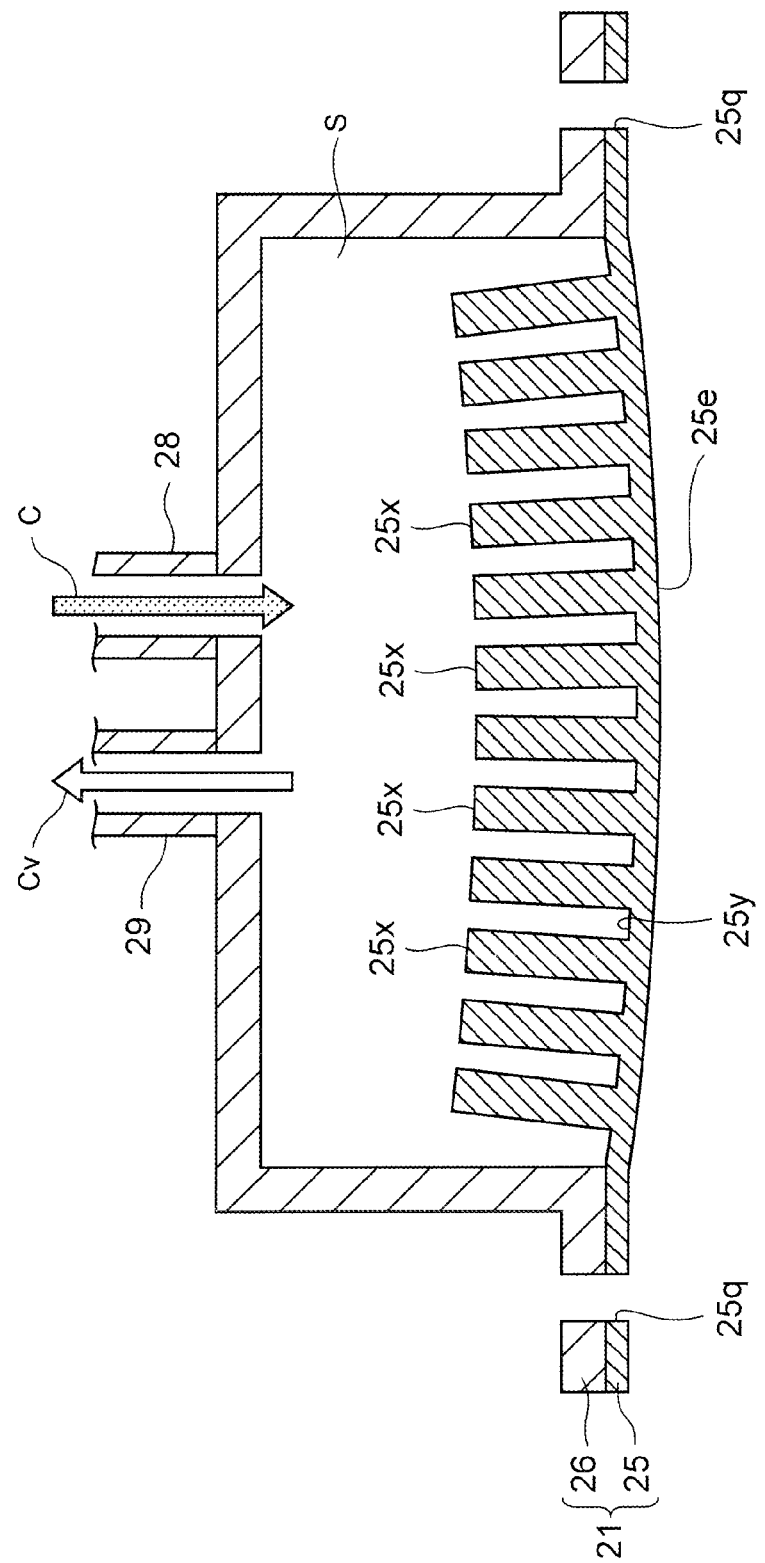
FIG. 6 is a cross-sectional view of the cooling component according to the present embodiment.

FIG. 6 is a cross-sectional view of the cooling component according to the present embodiment.

As illustrated in FIG. 6, the coolant C is supplied into a space S between the bottom plate 25 and the cover 26. Moreover, a plurality of pins 25x are provided to stand on a surface 25y of the bottom plate 25 exposed to the space S.

Spaces between the pins 25x are served as microchannel through which the coolant C flows. This design increases the area in which the coolant C is in contact with the bottom plate 25 as compared to the case where the surface 25y is a flat surface, and hence the coolant C can be efficiently vaporized by the heat of the bottom plate 25.

Moreover, in the present embodiment, an outer surface 25e of the bottom plate 25 is a spherical surface bulging to the outside of the cooling component 21.

The material of the bottom plate 25 is not particularly limited. For example, a metal material such as oxygen-free copper or aluminum which has good thermal conductivity and which can be easily processed into a spherical surface can be used as the material of the bottom plate 25.

Moreover, in the peripheral edge portions of the bottom plate 25 and the cover 26, holes 25q for inserting screws used to fix the cooling component 21 to an unillustrated circuit board are provided.

Figure 7:
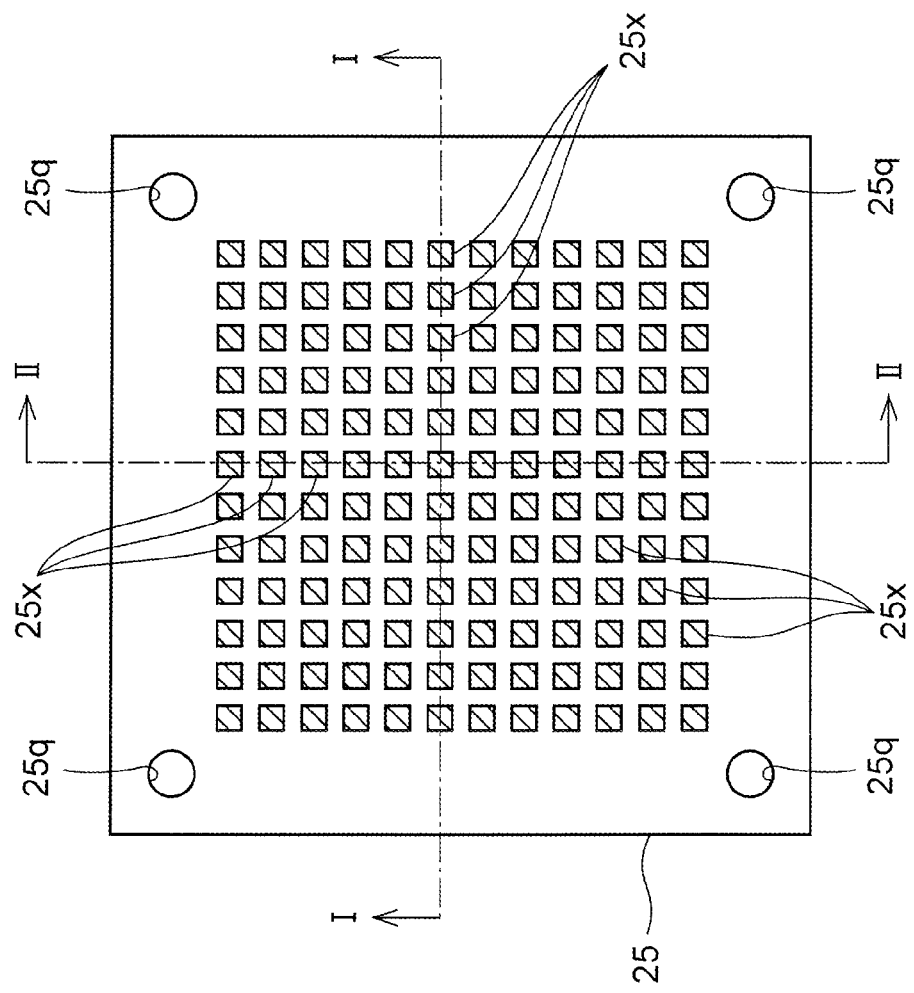
FIG. 7 is a top view of a bottom plate of the cooling component according to the present embodiment.

FIG. 7 is a top view of the bottom plate 25.

As illustrated in FIG. 7, the bottom plate 25 has a square shape in the top view, and the aforementioned holes 25q are provided at four corners of the bottom plate 25.

Although the planer shape of the pins 25x is not particularly limited. In this example, the planer shape of the pin 25x is made into a square shape, and the pins 25x are arranged in a grid like pattern in the bottom plate 25.

Figure 8A:
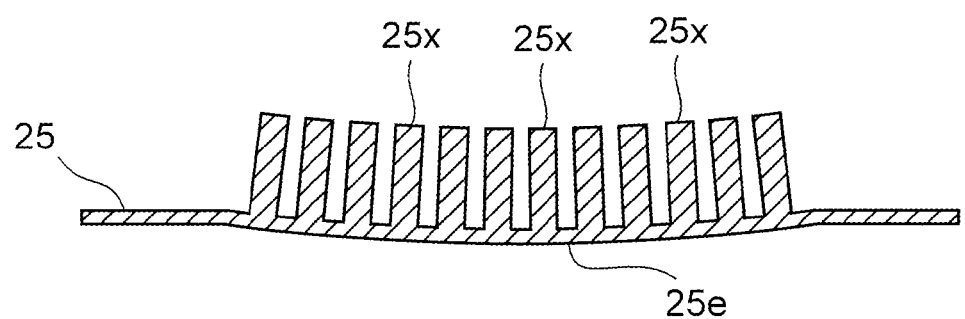
FIG. 8A is a cross-sectional view taken along the line I-I of FIG. 7.

FIG. 8A is a cross-sectional view taken along the line I-I of FIG. 7. Meanwhile, FIG. 8B is a cross-sectional view taken along the line II-II of FIG. 7 which is orthogonal to the line I-I.

Figure 8B:
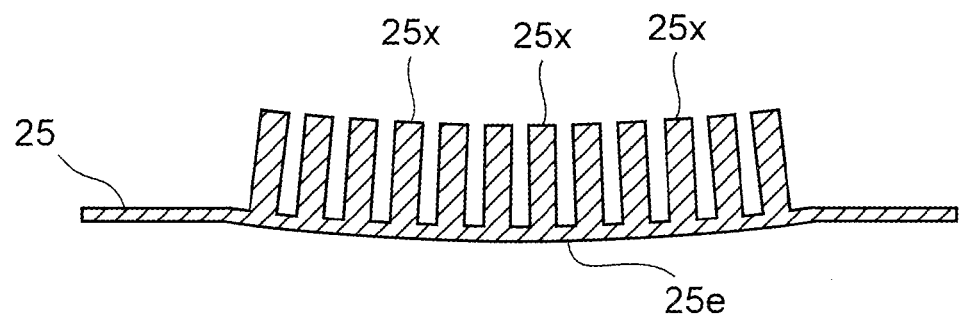
FIG. 8B is a cross-sectional view taken along the line II-II of FIG. 7.

Since the bottom plate 25 bulges in the spherical shape as described above, the cross-sectional shape of the outer surface 25e is a convex shape as illustrated in FIGS. 8A and 8B, regardless of the line along which the cross-section is taken.

Next, a method of joining the cooling component 21 to the electronic component 3 is described.

Figure 9A:
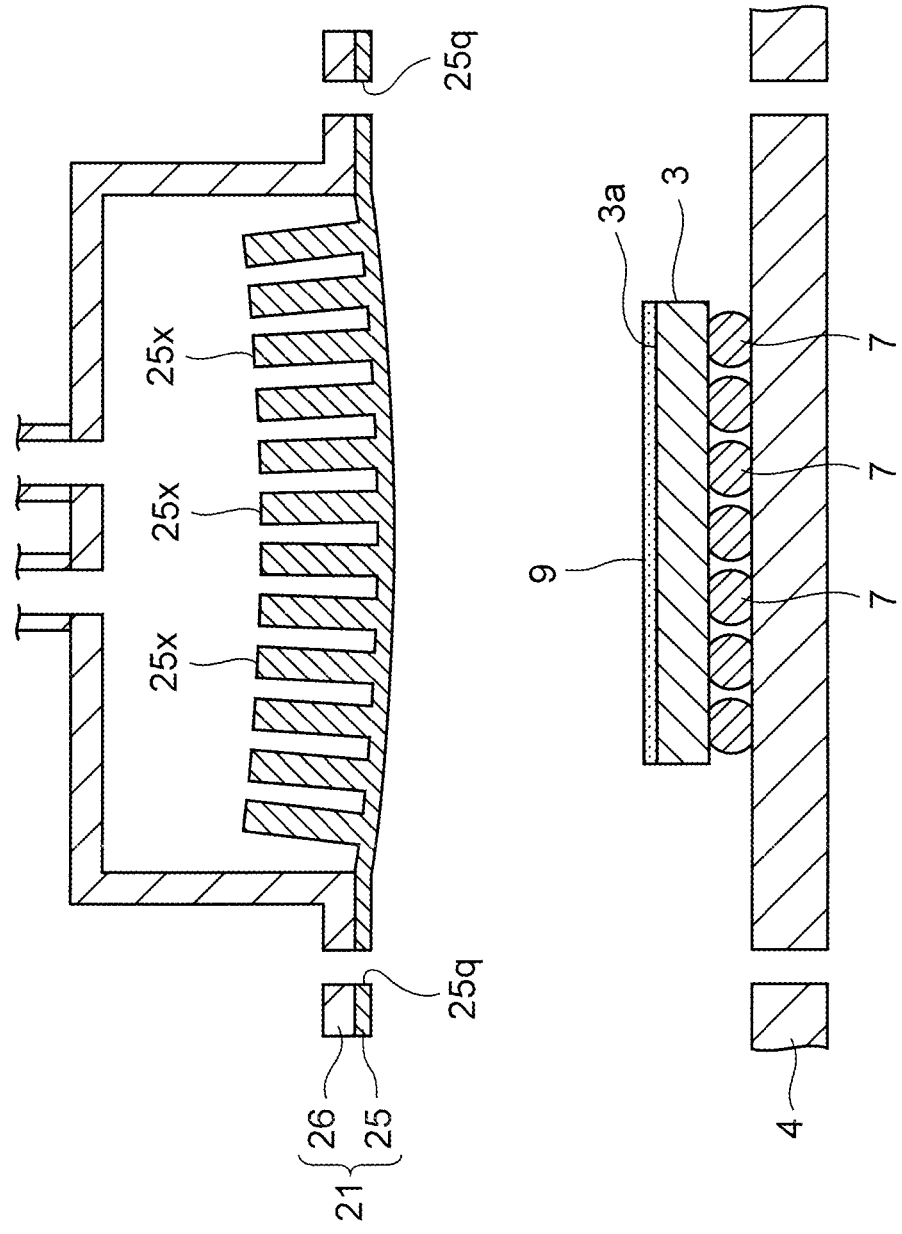
FIGS. 9A to 9C are schematic cross-sectional views for explaining a method of joining the cooling component according to the present embodiment.
Figure 9B:
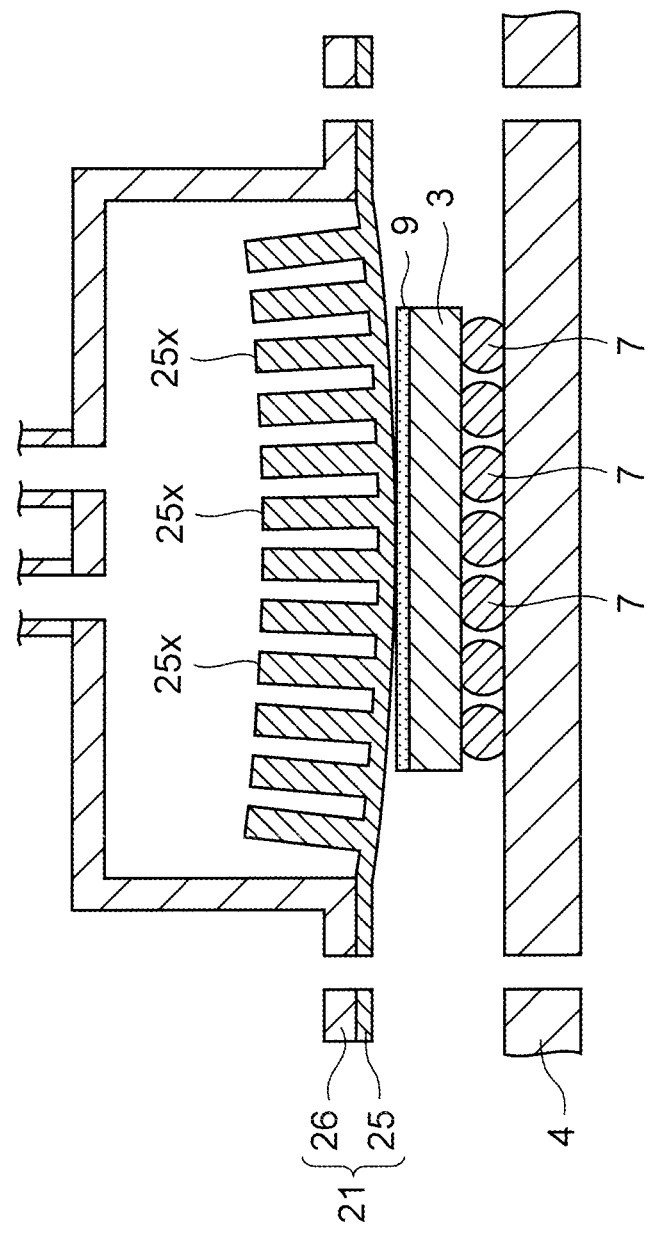
Figure 9C:
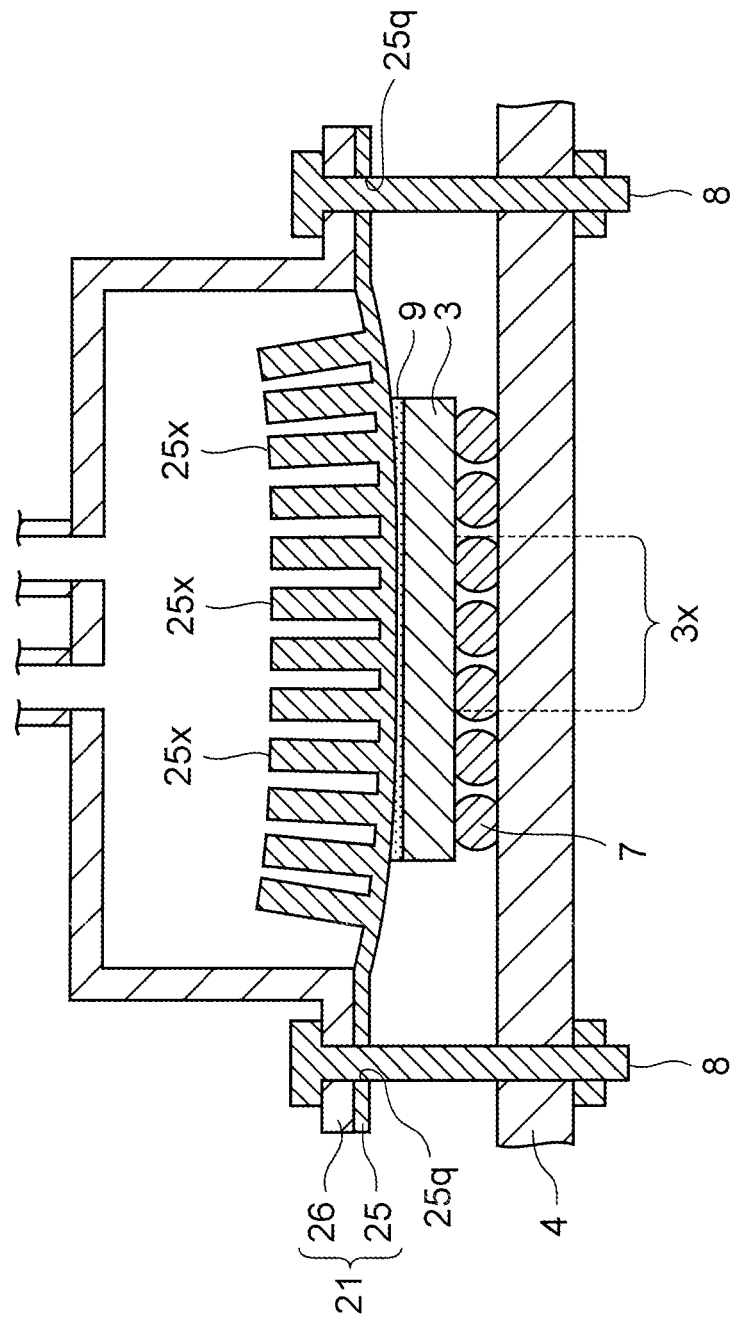

FIGS. 9A to 9C are schematic cross-sectional views for explaining the method of joining the cooling component according to the present embodiment.

Note that, in FIGS. 9A to 9C, the same elements as those described in FIGS. 1 to 7, 8A, and 8B are denoted by the same reference numerals as those in these figures, and description thereof is omitted below.

First, as illustrated in FIG. 9A, the circuit board 4 to which the electronic component 3 is fixed via the solder bumps 7 is prepared.

Then, thermal conductive grease is applied onto a flat top surface 3a of the electronic component as the thermal bonding material 9. Note that a thermal conductive sheet may be used instead of the thermal conductive grease as the thermal bonding material 9.

Then, the cooling component 21 is disposed over the electronic component 3.

Next, as illustrated in FIG. 9B, the cooling component 21 is lowered toward the electronic component 3, and the bottom plate 25 is brought into contact with the thermal bonding material 9.

Thereafter, as illustrated in FIG. 9C, the screws 8 are inserted into the holes 25q and are screwed to mechanically fix the cooling component 21 to the circuit board 4.

Here, since the bottom plate 25 has the spherical surface in the present embodiment, the center portion 3x of the electronic component 3 is brought into tight contact with the bottom plate 25 with the thermal bonding member provided therebetween when the bottom plate 25 is pressed against the electronic component 3 by the tightening force of the screws.

Figure 10:
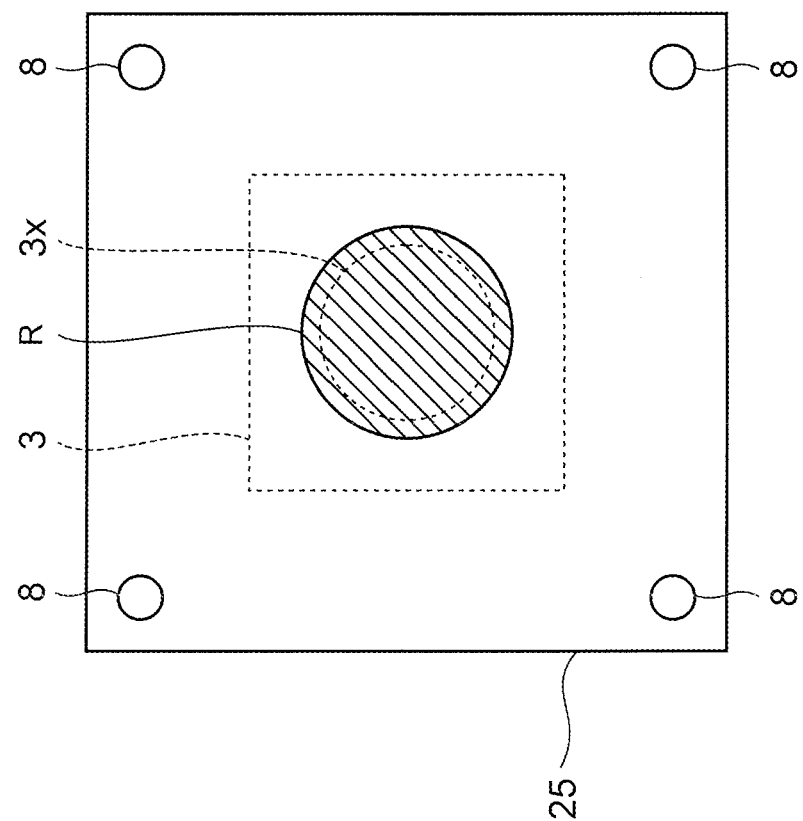
FIG. 10 is a plan view schematically illustrating a state where an electronic component is in tight contact with the bottom plate in the present embodiment.

FIG. 10 is a plan view schematically illustrating a state where the electronic component 3 is in tight contact with the bottom plate 25.

Note that in FIG. 10, the region R in which the bottom plate 25 and the electronic component 3 are considered to be in tight contact with each other are hatched as in FIG. 3.

As illustrated in FIG. 10, the aforementioned screws 8 are provided at the four corners of the square bottom plate 25.

Since the bottom plate 25 is pressed against the electronic component 3 evenly from four directions by the screws 8, the region R in which the bottom plate 25 and the electronic component 3 are in tight contact has a circular shape, and the center portion 3x of the electronic component 3 is included in the region R.

By these steps, the cooling component 21 is joined to the electronic component 3.

According to the present embodiment described above, since the outer surface 25e of the bottom plate 25 is the spherical surface bulging outward, it is possible to bring the center portion 3x of the electronic component 3 into tight contact with the bottom plate 25 with the thermal bonding material 9 provided therebetween. Therefore, it is possible to efficiently cool the center portion 3x which generates large amount of heat with the cooling component 21.

In addition, since the thermal bonding material 9 is provided between the electronic component and the bottom plate 25, air is expelled from the space between the electronic component 3 and the bottom plate 25. As a result, the heat resistance between the electronic component 3 and the bottom plate 25 is prevented from increasing due to air having poor heat conductivity, and hence the heat of the electronic component 3 can be quickly transferred to the cooling component 21.

Next, a comparative example is described.

Figure 11:
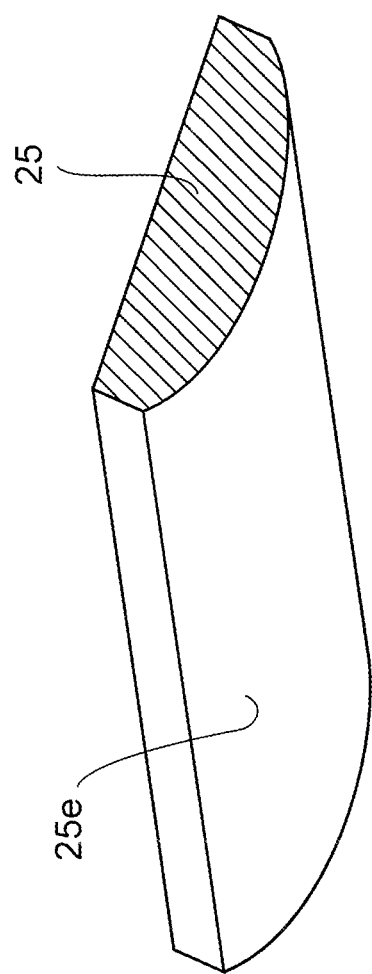
FIG. 11 is a perspective view of the bottom plate in a comparative example.

FIG. 11 is a perspective view of the bottom plate 25 in the comparative example.

In this comparative example, the outer surface 25e of the bottom plate 25 is a cylindrical surface.

Figure 12:
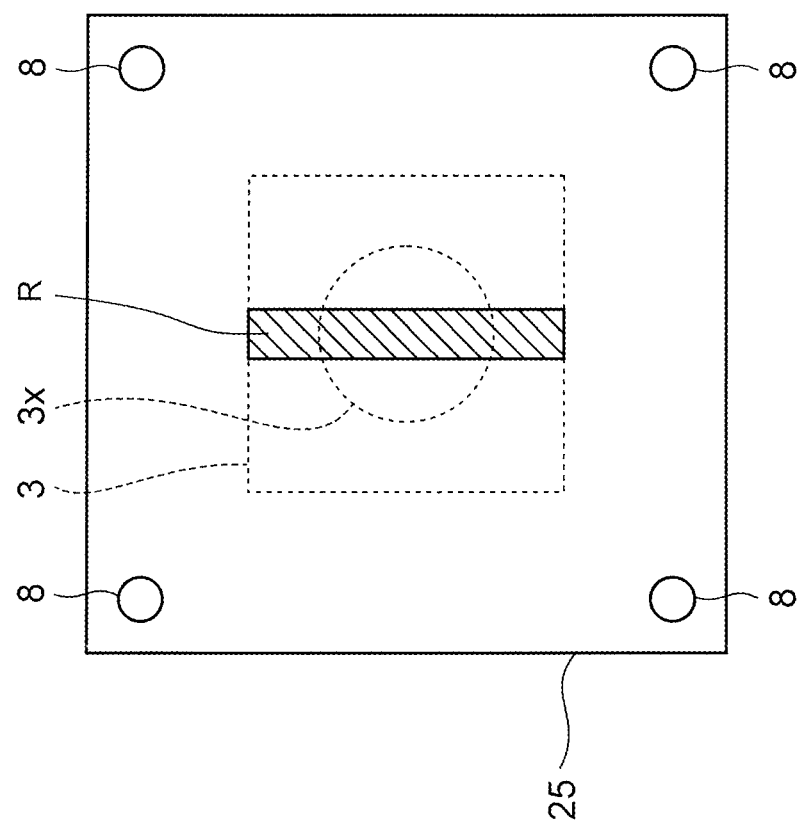
FIG. 12 is a plan view schematically illustrating a state where the electronic component is in tight contact with the bottom plate in the comparative example.

FIG. 12 is a plan view schematically illustrating a state where the electronic component 3 is in tight contact with the bottom plate 25 in the comparative example.

In FIG. 12, the region R in which the bottom plate 25 and the electronic component 3 are considered to be in tight contact with each other are hatched as in FIG. 10.

Since the outer surface of the bottom plate is the cylindrical surface in the comparative example as described above, the region R in which the bottom plate 25 and the electronic component 3 are in tight contact with each other becomes a strip shape. In this case, the entire center portion 3x of the electronic component 3 cannot be brought into tight contact with the bottom plate 25. Therefore, it becomes insufficient to cool the center portion 3x in which the amount of heat generated is particularly great in the electronic component 3 and which thus needs to be preferentially cooled.

Figure 13:
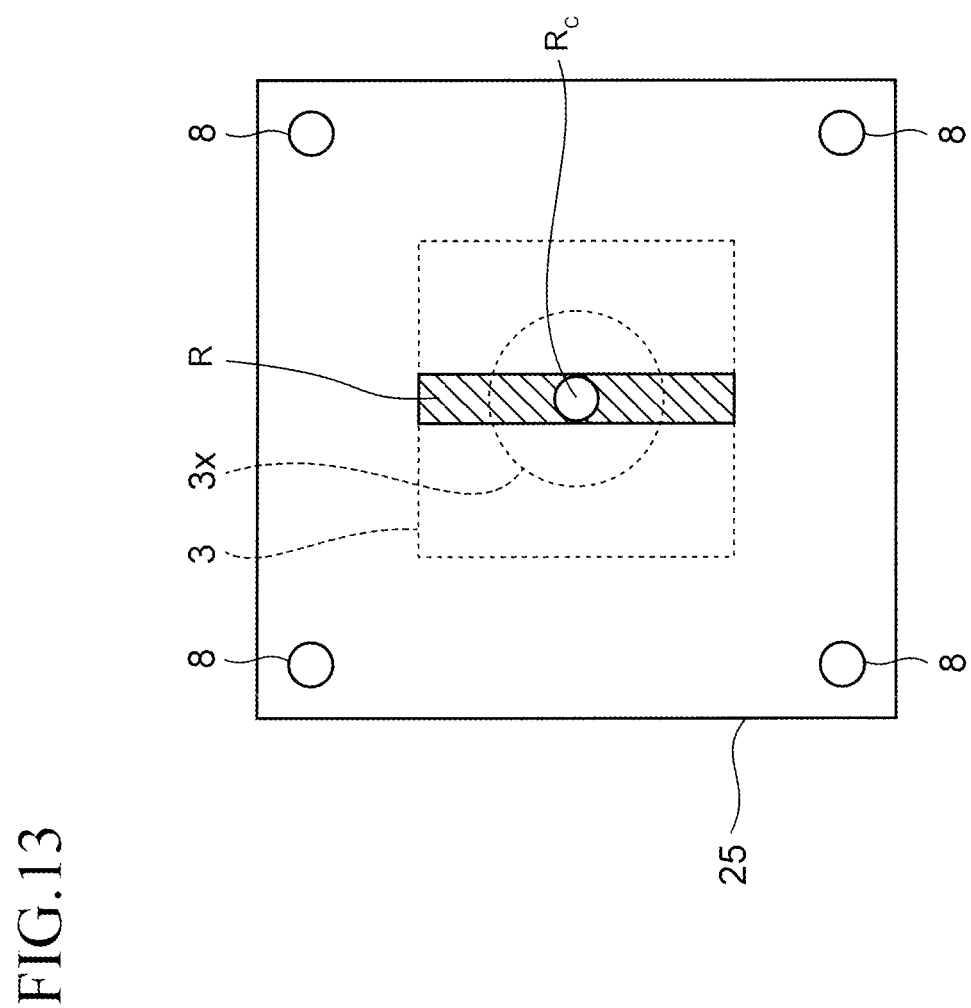
FIG. 13 is a plan view for schematically explaining another problem occurring in the comparative example.

FIG. 13 is a plan view for schematically explaining another problem occurring in the comparative example.

In the example of FIG. 13, the bottom plate 25 is curved due to tight fastening of the screws 8 at the four corners of the bottom plate 25, and the bottom plate 25 is lifted from the electronic component 3 around the center $R_c$ of the region R. In this case, it becomes more difficult to cool the center portion 3x of the electronic component 3.

Accordingly, in order to efficiently cool the center portion 3x of the electronic component 3, it is effective to make the outer surface 25e into the spherical surface as in the embodiment, not into the cylindrical surface.

Next, a method of manufacturing the cooling component 21 according to the present embodiment is described.

FIGS. 14A to 14D are cross-sectional views in the course of manufacturing of the cooling component 21 according to the present embodiment.

In FIGS. 14A to 14D, the same elements as those described in FIGS. 1 to 7, 8A, 8B, 9A to 9C, and 10 to 13 are denoted by the same reference numerals as those in these figures, and description thereof is omitted below.

First, as illustrated in FIG. 14A, a copper plate made of oxygen-free copper and having a square planer shape, whose length of one edge is about 40 mm to 60 mm, is prepared as the bottom plate 25. Note that an aluminum plate may be used as the bottom plate 25 instead of the copper plate.

Next, as illustrated in FIG. 14B, the holes 25q are formed in the peripheral edge portion of the bottom plate 25 by drilling.

Thereafter, the plurality of pins 25x, whose height Z is about 10 mm, are formed by cutting the bottom plate 25.

The thickness D of the bottom plate 25 after the formation of the pins 25x is preferably made as small as possible so that the heat of the electronic component 3 (see FIG. 9C) can be quickly transferred in the bottom plate 25. In this example, the thickness D is set equal to or thinner than 3 mm.

However, when the thickness D is too thin, the bottom plate 25 may be excessively deformed when being bulged in a spherical shape as will be described later. Accordingly, it is preferable to set the thickness D equal to or thicker than 1.5 mm.

Figure 15:
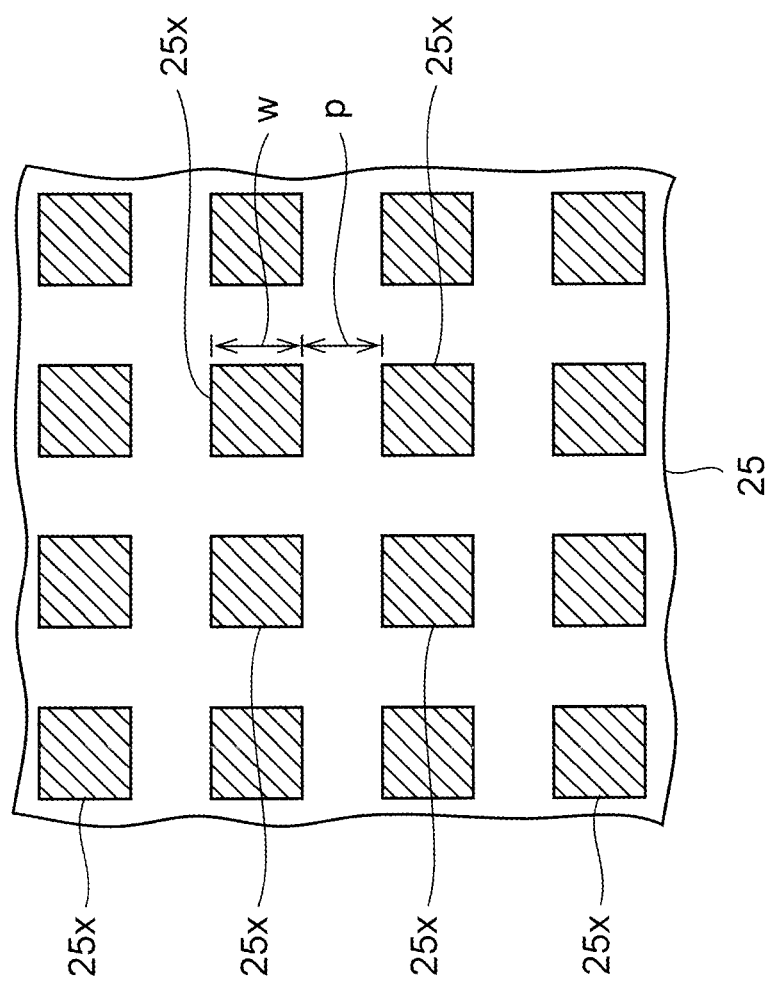
FIG. 15 is an enlarged plan view of the bottom plate in which pins are formed according to the present embodiment.

FIG. 15 is an enlarged plan view of the bottom plate 25 in which the pins 25x are formed in this manner.

The size of each pin 25x is not particularly limited. In the present embodiment, the pin 25x has a square shape whose length W of one edge is about 1.2 mm to 1.3 mm, and an interval p between the adjacent pins 25x is, for example, about 0.7 mm to 0.8 mm.

Note that instead of forming the pins 25x by cutting in this manner, the pins 25x of circular planer shape may be formed by forging.

Figure 14C:
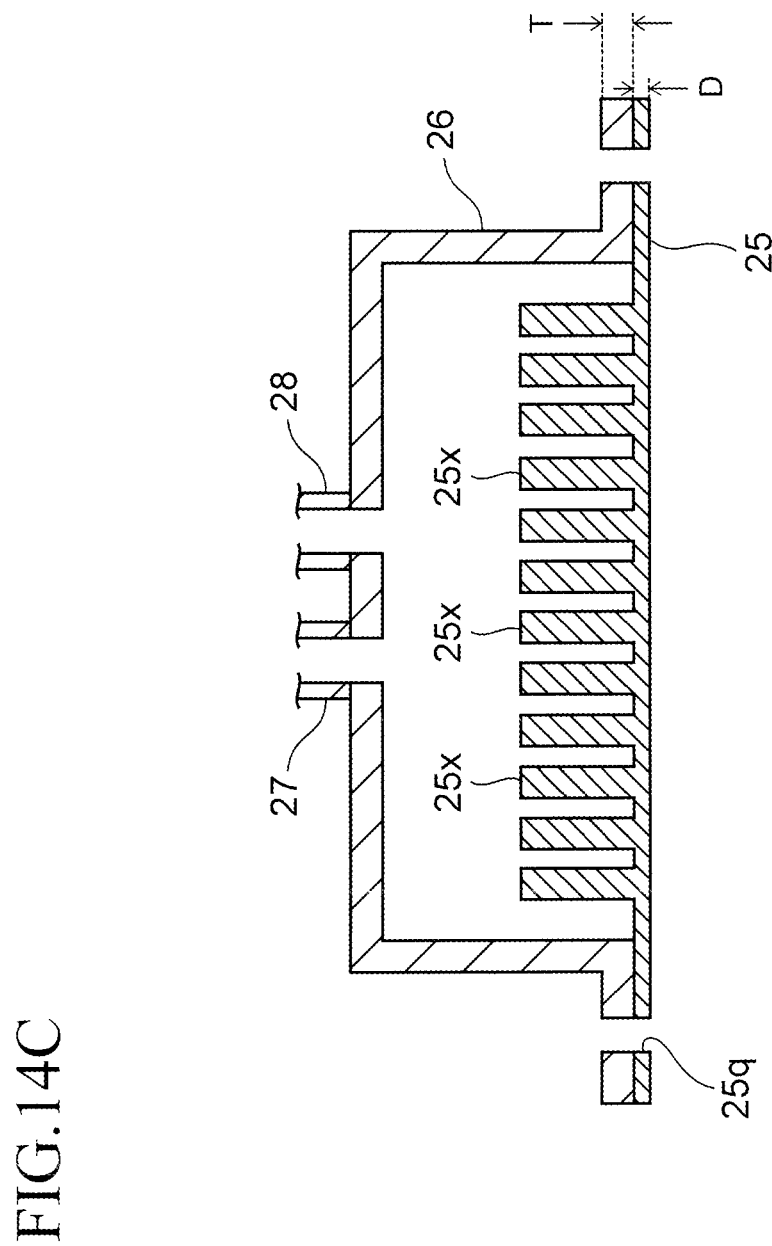

Next, as illustrated in FIG. 14C, the cover 26 is prepared.

The material of the cover 26 may be the same or different as the material of the bottom plate 25. For example, oxygen-free copper or aluminum can be used as the material of the cover 26.

Moreover, the thickness T of the cover 26 is not particularly limited, as long as the thickness T is thicker than the thickness D of the bottom plate 25. In this example, the thickness T is about 4 mm.

Then, while heating the bottom plate 25 and the cover 26 to about 700° C., the peripheral edge portions of the bottom plate 25 and the cover 26 are blazed to each other by using unillustrated blazing material such as silver.

Thereafter, the first pipe 27 and the second pipe 28 are joined to the cover 26 by brazing.

Figure 14D:
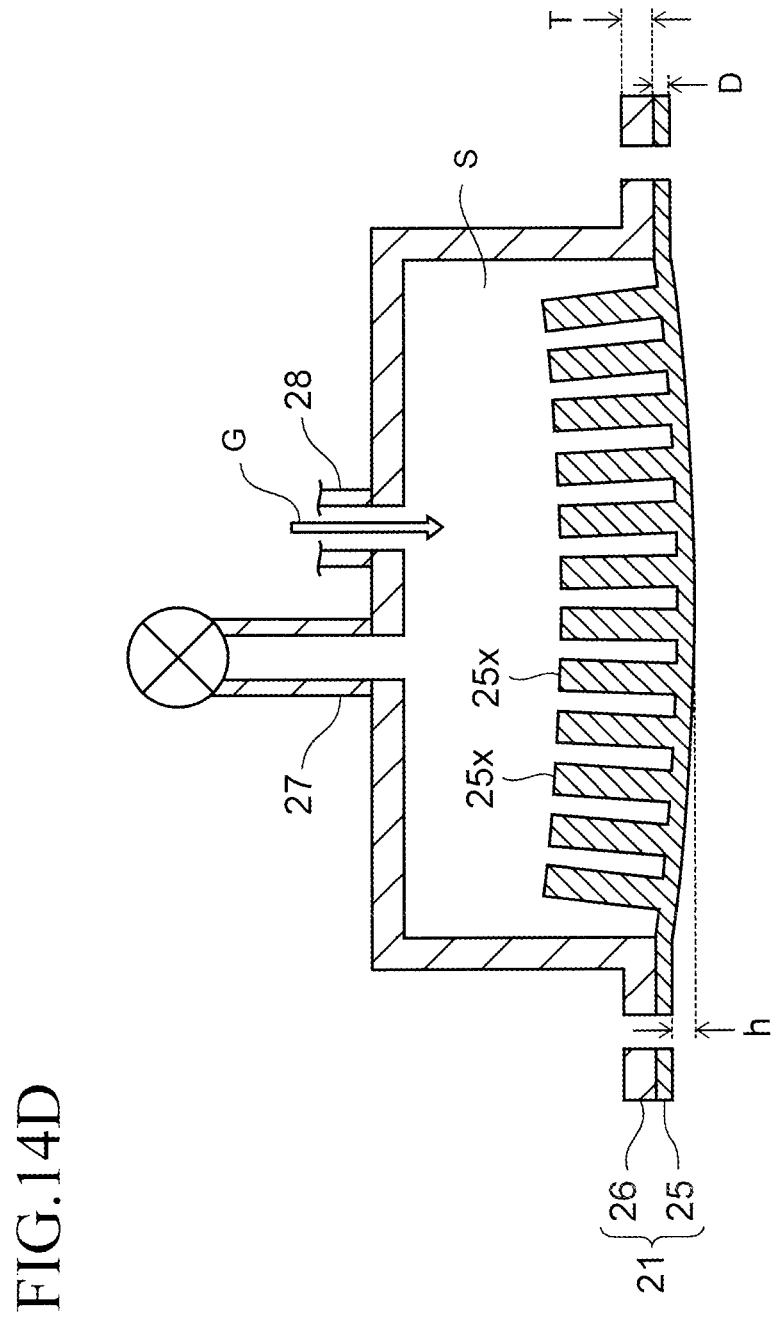

Next, the step illustrated in FIG. 14D is described.

First, the first pipe 27 is closed and, in this state, the bottom plate 25 is heated to be softened. At this time, when the heating temperature is too high, the silver brazing material joining the bottom plate 25 and the cover 26 to each other melts or recrystallization of the material of the bottom plate occurs to cause excessive softening of the bottom plate 25. Accordingly, it is preferable to heat the bottom plate 25 to a temperature of about 500° C. at which recrystallization of the bottom plate 25 does not occur and which is lower than the melting point of the silver brazing material.

Then, in this state, argon gas is supplied as pressurized gas G into the space S from the second pipe 28 at a pressure of about 0.5 MPa, and thereby bulges the bottom plate 25 softened by being heated into the spherical shape.

In the present embodiment, since the thickness T of the cover 26 is made larger than the thickness D of the bottom plate 25 as described above, the strength of the cover 26 is stronger than that of the bottom plate 25, and hence the cover 26 can be prevented from being deformed by the pressure of the pressurized gas G.

Moreover, since the argon gas used as the pressure gas G does not contain oxygen, the bottom plate 25 whose reactivity is increased due to the heating can be prevented from being oxidized by the pressurized gas G. Note that in addition to the argon gas, there is nitrogen gas as the pressure gas G containing no oxygen.

Moreover, since the pins 25x does not prevent the bottom plate 25 from bulging, it is possible to obtain the spherical shaped bottom plate 25, as well as to define the microchannel by the pins 25x.

Note that when the bottom plate 25 is excessively bulged in this step, the region R (see FIG. 10) in which the bottom plate 25 comes into tight contact with the electronic component 3 becomes smaller. Accordingly, the height h from the peripheral portion of the bottom plate 25 to a top portion thereof is preferably suppressed to 0.1 mm or less so as to sufficiently broaden the region R.

Thereafter, the bottom plate 25 is cooled to a room temperature, and a basic structure of the cooling component 21 according to the present embodiment is thereby obtained.

According to the method of manufacturing the cooling component 21 described above, the spherical shaped bottom plate 25 can be easily obtained only by bulging the bottom plate 25 that is softened by heating. Therefore, the cost of manufacturing the cooling component 21 can be reduced as compared to the case where the bottom plate 25 is formed into the spherical shape by machining such as cutting.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of joining a cooling component comprising:
    bulging a bottom plate of a cooling component into a part of a spherical shape by supplying pressurized gas into the cooling component; and joining an electronic component and the bottom plate of the cooling component to each other by pressing an outer surface of the bottom plate after the bulging, the outer surface having the part of the spherical shape bulging outward, against the electronic component, while providing a thermal bonding material between the outer surface of the bottom plate and the electronic component.

2. The method of joining a cooling component according to claim 1, wherein the bulging the bottom plate is performed while heating the bottom plate.

3. The method of joining a cooling component according to claim 1, wherein the cooling component includes a cover thicker than the bottom plate, and the pressurized gas is supplied into a space between the cover and the bottom plate.

4. The method of joining a cooling component according to claim 3, wherein a plurality of pins are provided to stand on a surface of the bottom plate exposed to the space.

* * * * *